(12) United States Patent
Miyahara et al.

(10) Patent No.: US 6,591,745 B2
(45) Date of Patent: Jul. 15, 2003

(54) SCREEN PRINTING APPARATUS AND SCREEN PRINTING METHOD

(75) Inventors: Seiichi Miyahara, Fukuoka (JP); Michinori Tomomatsu, Fukuoka (JP); Seikou Abe, Fukuoka (JP); Kimiyuki Yamasaki, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/781,546

(22) Filed: Feb. 13, 2001

(65) Prior Publication Data

US 2001/0023645 A1 Sep. 27, 2001

(30) Foreign Application Priority Data

Feb. 17, 2000 (JP) ........................................ 2000-039574

(51) Int. Cl.[7] .............................................. B05C 17/04
(52) U.S. Cl. ......................................... 101/123; 118/410
(58) Field of Search ................................. 101/114, 119, 101/120, 123, 124, 126, 129; 118/213, 301, 323, 406, 410, 413; 427/96, 272, 282, 376.2

(56) References Cited

U.S. PATENT DOCUMENTS 5,524,537 A * 6/1996 van der Meulen .......... 101/120
5,947,022 A * 9/1999 Freeman et al. ............ 101/123
6,158,338 A * 12/2000 MacRaild et al. .......... 101/123

FOREIGN PATENT DOCUMENTS

| GB | 2352209 A | 1/2001 |
| JP | 3-106651 | 5/1991 |
| JP | 9-239955 | 9/1997 |
| JP | 11-20128 | 1/1999 |
| JP | 2000-94637 | 4/2000 |
| WO | WO 98/16387 | 4/1998 |

* cited by examiner

*Primary Examiner*—Ren Yan
(74) *Attorney, Agent, or Firm*—McDermott, Will & Emery (57) ABSTRACT

It is possible to obtain a screen printing apparatus and a screen printing method wherein a high pressing force is not required to print paste on a substrate thereby assuring reliable printing qualities. In the screen printing apparatus which prints the paste on the substrate through pattern holes, the paste in a storage section is pressurized and forced out of a printing space portion through a transfer passage. The paste is given a rolling motion while it is guided by rolling guide surfaces disposed at the printing space portion, and then, the paste is filled into the pattern holes from a printing aperture formed by two scraping members.

27 Claims, 3 Drawing Sheets

SCREEN PRINTING APPARATUS AND SCREEN PRINTING METHOD

FIELD OF THE INVENTION

The present invention relates to a screen printing apparatus and a screen printing method for printing cream solder, conductive paste or like paste on a substrate.

BACKGROUND OF THE INVENTION

Conventionally, screen printing has been adopted for printing cream solder, conductive paste or like paste on substrates in a process of mounting electronic components on a substrate. This method comprises a process of setting a mask plate with pattern holes provided therein according to the printing portions and a process of printing paste on a substrate by squeezing same through the pattern holes of the mask plate.

As a squeezing method for such screen printing, a method using a closed type squeegee head is known. In this method, a squeegee head provided with a paste storage container having an opening at the bottom thereof is used. With the opening pressed against the mask plate, the paste in the paste storage container is pressurized so that the paste is pressed and filled into the pattern holes of the mask plate through the opening. And then, the squeegee head is slid on the mask plate, thereby filling the paste into each pattern hole in order.

In such a conventional screen printing method using a closed type squeegee head, there are problems as described in the following. In order to fill the paste into the pattern holes in good condition, it is necessary to apply an appropriate pressure to the paste being stored. That is, if the pressure is not high enough, a sufficient amount of paste will not be filled into the pattern holes. Also, if the pressure is too high, the paste will be forced out of the pattern holes on the mask plate surface. Accordingly, the pressure applied should be appropriate to satisfy various conditions with respect to the type of the mask plate and the characteristics of the paste. However, it is not easy to properly set and maintain at all times the pressure and other printing conditions in accordance with printing objects which come in a variety of types and shapes. Therefore, it has been practically difficult to assure reliable printing qualities in such conventional printing.

The present invention is intended to provide a screen printing apparatus and a screen printing method by which reliable printing qualities may be obtained at all times.

SUMMARY OF THE INVENTION

A screen printing apparatus of the present invention for printing paste on a substrate comprises:
 (a) a positioning member on which the substrate is placed,
 (b) a mask plate with a pattern hole, in which the mask plate is located above the positioning member, and
 (c) a squeegee head which slides on the surface of the mask plate;
 wherein the squeegee head comprises:
 (d) a printing section, and (e) a pressure section; and the printing section comprises:
 (f) a storage section to store paste,
 (g) a printing space portion with a bottom opening, in which the printing space portion is formed below the storage section,
 (h) a transfer passage providing a communication between the storage section and the printing space portion, in which the transfer passage is formed between the storage section and the printing space portion, and
 (i) scraping members disposed at the bottom of the printing space portion; and
 the printing space portion includes (j) rolling guide surfaces to enhance the rolling motion of the paste,
 wherein the paste stored in the storage section is pressurized by the pressure member while the squeegee head is sliding on the mask plate,
 the paste stored in the storage section is filled into the printing space portion through the transfer passage, and
 the rolling guide surfaces of the printing space portion serve to enhance the rolling motion of the paste, then the rolling paste is forced out of the bottom opening of the printing space portion and is printed on the substrate via the mask plate.

A screen printing method of the present invention for printing paste on a substrate comprises the steps of:
 (a) sliding a squeegee head on the surface of a mask plate placed on the substrate,
 (b) filling paste into pattern holes formed in the mask plate when the paste is forced out of a printing aperture at the bottom of the squeegee head according to the sliding operation of the squeegee head, and
 (c) printing the paste, filled into the pattern holes, on the substrate;
 wherein the step of sliding the squeegee head and forcing the paste out of the printing aperture comprises the steps of:
 (d) pressurizing the paste stored in a storage section,
 (e) forcing the pressurized paste out into a printing space portion through a transfer passage,
 (f) enhancing the rolling motion of the paste forced out into the printing space portion, and
 (g) forcing the rolling paste out of the printing aperture.

With this configuration, the paste is precisely printed on the substrate. The paste is accurately printed on the substrate in accordance with the shape of the pattern formed in the mask plate. As a result, it is possible to assure reliable printing qualities.

BRIEF DESCRIPTION OF THE DRAWINGS

FIG. 3(*a*) is a sectional side elevation of a squeegee head screen printing in an embodiment of the present invention, FIG. 3(*b*) is a sectional side elevation of a squeegee head for screen printing in an embodiment of the present invention.

DESCRIPTION OF THE REFERENCE NUMERALS

6 Substrate
10 Screen mask
12 Mask plate
12*a* Pattern hole
13 Squeegee head
14 Printing section
20 Main body
21 Cartridge 22 Paste, cream solder
23 Pressure plate
24 Cylinder
25 Transfer passage
26 Printing space portion
26A First rolling guide surface
26B Second rolling guide surface
27A First scraping member
27B Second scraping member

DETAILED DESCRIPTION OF THE INVENTION

A screen printing apparatus in an embodiment of the present invention is used for printing paste on the surface of a substrate. The screen printing apparatus comprises:
(a) a positioning member on which the substrate is placed,
(b) a mask plate with pattern holes, in which the mask plate is located above the positioning member, and
(c) a squeegee head which slides on the surface of the mask plate;
wherein the squeegee head comprises:
(d) a printing section, and (e) a pressure section; and
the printing section comprises:
(f) a storage section to store paste,
(g) a printing space portion with a bottom opening, in which the printing space portion is formed below the storage section,
(h) a transfer passage providing a communication between the storage section and the printing space portion, which is formed between the storage section and the printing space portion, and
(i) scraping members disposed at the bottom of the printing space portion; and
the printing space portion includes (j) rolling guide surfaces to enhance the rolling motion of the paste,
wherein the paste stored in the storage section is pressurized by the pressure member while the squeegee head is sliding on the mask plate,
the paste stored in the storage section is filled into the printing space portion through the transfer passage, and
the rolling guide surfaces of the printing space portion serve to enhance the rolling motion of the paste, then the rolling paste is forced out of the bottom opening of the printing space portion and is printed on the substrate via the mask plate.

Preferably, the storage section, the printing space portion and the transfer passage are formed of main body members.

Preferably, the transfer passage includes a reduced portion having a sectional area reduced.

Preferably, the scraping members include a first scraping member disposed at the back side in the forward direction of the squeegee head, and a second scraping member disposed at the front side in the forward direction of the squeegee head;
the first scraping member forms a rear wall for the printing space, and the second scraping member forms a front wall for the printing space;
a printing aperture is formed between the first scraping member and the second scraping member, and the paste is pushed out of the printing aperture.

Preferably, the storage section, the printing space portion and the transfer passage are formed of main body members, and the transfer passage includes a reduced portion having a sectional area reduced, and
the scraping members include a first scraping member disposed at the back side in the forward direction of the squeegee head, and a second scraping member disposed at the front side in the forward direction of the squeegee head;
the first scraping member forms a rear wall for the printing space, and the second scraping member forms a front wall for the printing space;
a printing aperture is formed between the first scraping member and the second scraping member, and the paste is pushed out of the printing aperture.

Preferably, the rolling guide surfaces are upper surfaces to form the printing space.

Preferably, the rolling guide surfaces have a sectional shape with R curvature.

Preferably, the storage section includes a cartridge to store the paste, and the cartridge disposed can be removed from the storage section.

Preferably, the reduced portion has a plurality of smaller-diameter paths formed in honeycomb structure, and the paste is forced out into the printing space through the plurality of smaller-diameter paths.

Preferably, the first scraping member is disposed at the back of a position just under the transfer passage, and the second scraping member is disposed at the front of a position just under the transfer passage, and the printing aperture is positioned just below the transfer passage.

Preferably, the storage section, the transfer passage and the printing space portion are formed of main body members. Each member of the first scraping member and the second scraping member has a plate-like shape, and each of the scraping members is obliquely disposed at the bottom of the main body member so that the printing space is reduced in sectional area toward the printing aperture.

Preferably, the storage section, the transfer passage and the printing space portion are positioned just above the printing aperture.

Preferably, the printing space has a top opening that leads to the transfer passage; and the rolling guide surfaces include a first rolling guide surface positioned at the back of the top opening and a second rolling guide surface positioned at the front of the top opening, respectively in the forward direction of the squeegee head; and the first rolling guide surface is circularly curved about a specific position within the printing space, and the second rolling guide surface is circularly curved about another specific position within the printing space.

Preferably, the storage section, the transfer passage and the printing space portion are positioned just above the printing aperture, and the printing space has a top opening that leads to the transfer passage; and the rolling guide surfaces include a first rolling guide surface positioned at the back of the top opening and a second rolling surface positioned at the front of the top opening, respectively in the forward direction of the squeegee head; and the first rolling guide surface is circularly curved about a specific position within the printing space, and the second rolling guide surface is circularly curved about another specific position within the printing space; and the first rolling guide surface and the second rolling guide surface are symmetrically shaped with respect to the vertical plane passing through the center of the printing aperture.

Preferably, the first scraping member that forms the rear wall of the printing space has such a bottom shape as to scoop the paste sticking to the plate surfaces except the pattern holes and to return the paste into the printing space when the squeegee head moves in the forward direction; and the rolling motion of the paste is enhanced due to the operation of returning the scooped paste into the printing space portion as well as the function of the rolling guide surfaces.

Preferably, the transfer passage includes a reduced portion, and the reduced portion has a shape such that the paste is decreased in kinetic viscosity.

Preferably, the paste used is at least one of cream solder and conductive paste.

A screen printing apparatus in an embodiment of the present invention is operated to print paste on a substrate through pattern holes of a mask plate by sliding a squeegee head on the mask plate. The screen printing apparatus comprises a paste storage section to store the paste in the squeegee head, a pressure section to pressurize the paste stored in the paste storage section, a printing space portion to contain the pressurized paste and to make it contacted on the surface of the mask plate, a paste transfer passage located between the paste storage section and the printing space portion, a reduced portion created in the transfer passage, and two scraping members. The reduced portion is shaped so as to reduce the sectional area of the transfer passage. The two scraping members form front and rear walls in the squeezing direction of the printing space portion. The bottom ends of the scraping members are abutted on the surface of the mask plate. There are provided rolling guide surfaces at the printing space portion, which serve to enhance the rolling motion of the paste in the printing space during squeezing operation.

A screen printing method in an embodiment of the present invention for printing paste on a substrate comprises the steps of:

(a) sliding a squeegee head on the surface of a mask plate placed on the substrate, (b) filling the paste forced out of a printing aperture of the squeegee head into pattern holes formed in the mask plate according to sliding operation of the squeegee head, and (c) printing the paste, filled into the pattern holes, on the substrate;

wherein the step of sliding the squeegee head and forcing the paste out of the printing aperture comprises the steps of:

(d) pressurizing the paste stored in a storage section, (e) forcing the pressurized paste out into a printing space portion through a transfer passage, (f) enhancing the rolling motion of the paste forced out into the printing space portion, and (g) forcing the rolling paste out of the printing aperture.

Preferably, the transfer passage has a reduced portion, and the process (e) includes a process of making the pressurized paste pass through the reduced portion and a process of decreasing the kinetic viscosity of the paste while the paste passes through the reduced portion.

Preferably, the squeegee head comprises:

a printing space portion formed below the storage section, a transfer passage formed between the storage section and the printing space, which provides communication between the storage section and the printing space, and scraping members disposed at the bottom of the printing space portion; and the scraping members include a first scraping member disposed at the back side in the forward direction of the squeegee head and a second scraping member disposed at the front side in the forward direction of the squeegee head; and the first scraping member forms a rear wall for the printing space portion, and the second scraping member forms a front wall for the printing space portion; and a printing aperture is formed between the first scraping member and the second scraping member, and the paste is forced out of the printing aperture.

Preferably, the process (a) includes a process of moving the squeegee head horizontally with the paste filled in the printing space.

Preferably, the process (a) includes a process of moving the squeegee head horizontally while pressurizing the paste stored in the storage section.

Preferably, when the squeegee head moves in the forward direction, the first scraping member that forms the rear wall of the printing space scoops the paste sticking to the plate surfaces except the pattern holes and returns the paste into the printing space; and the rolling motion of the paste is enhanced due to the operation of returning the scooped paste into the printing space portion as well as the function of the rolling guide surfaces.

Preferably, the printing space portion includes rolling guide surfaces having a sectional shape with R curvature, and the rolling motion of the paste is enhanced when the paste moves along the rolling guide surfaces.

Preferably, the printing space has a top opening that leads to the transfer passage; the rolling guide surfaces includes a first rolling guide surface positioned at the back of the top opening and a second rolling guide surface positioned at the front of the top opening, respectively in the forward direction of the squeegee head; and the first rolling guide surface is circularly curved about a specific position within the printing space, and the second rolling guide surface is circularly curved about another specific position within the printing space.

A screen printing method in an embodiment of the present invention is employed to print paste on a substrate through pattern holes of a mask plate by sliding a squeegee head on the mask plate.

The screen printing method comprises the steps of:

(a) pressurizing the paste stored in a paste storage section, (b) feeding the pressurized paste into a printing space portion surrounded by two scraping members through a reduced portion having a sectional area reduced, where the printing space portion communicates with the reduced portion and also the bottom ends of the two scraping members are abutted on the surface of the mask plate, (c) enhancing the rolling motion of the paste in the printing space portion by the function of the rolling guide surfaces, and (d) filling the rolling paste into the pattern holes formed in the mask plate.

With the above configuration, the paste in the paste storage section is pressurized and is led into the printing space portion located above the mask plate, then the rolling motion of the paste in the printing space portion is enhanced by the rolling guide surfaces during squeezing operation. In this way, the rolling ability of the paste will be improved. Accordingly, a high pressure is not required to fill the paste into the pattern holes. As a result, it is possible to obtain a screen printing apparatus and a screen printing method capable of assuring reliable printing qualities.

Exemplary Embodiment

Next, an exemplary embodiment of the present invention will be described with reference to the drawings.

Figure 1:
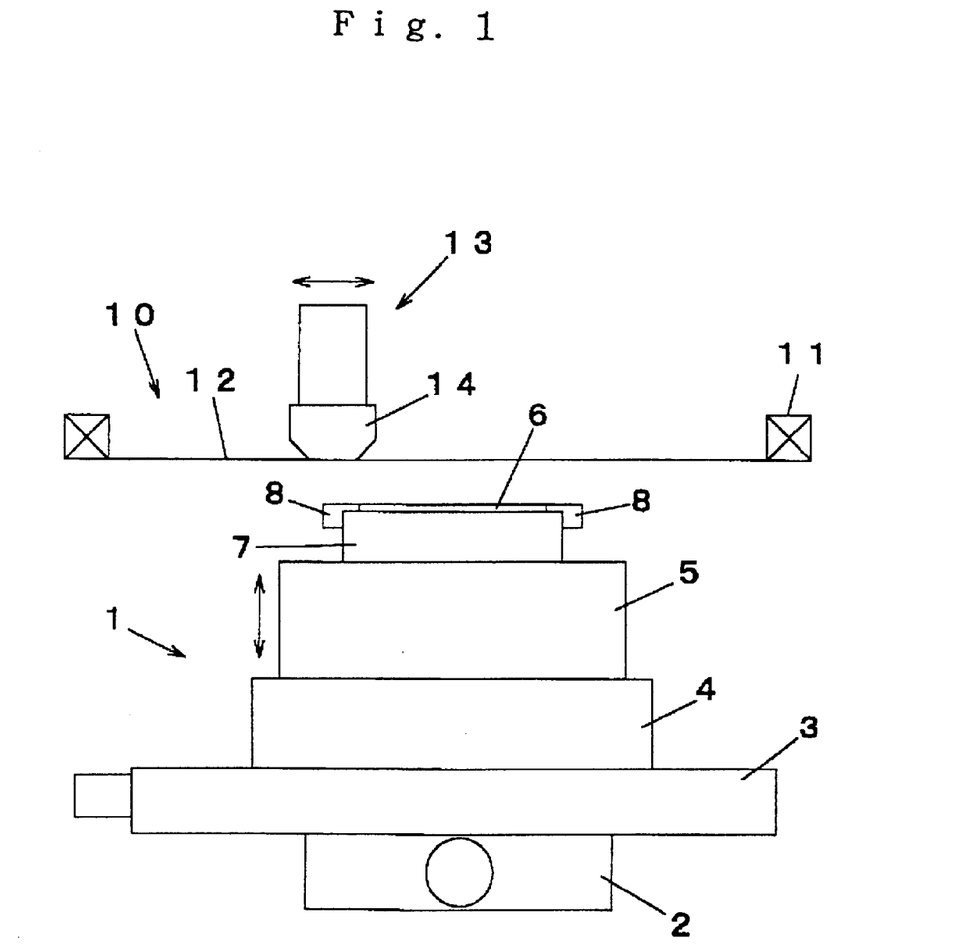
FIG. 1 is a side view of a screen printing apparatus in an embodiment of the present invention.
Figure 2:
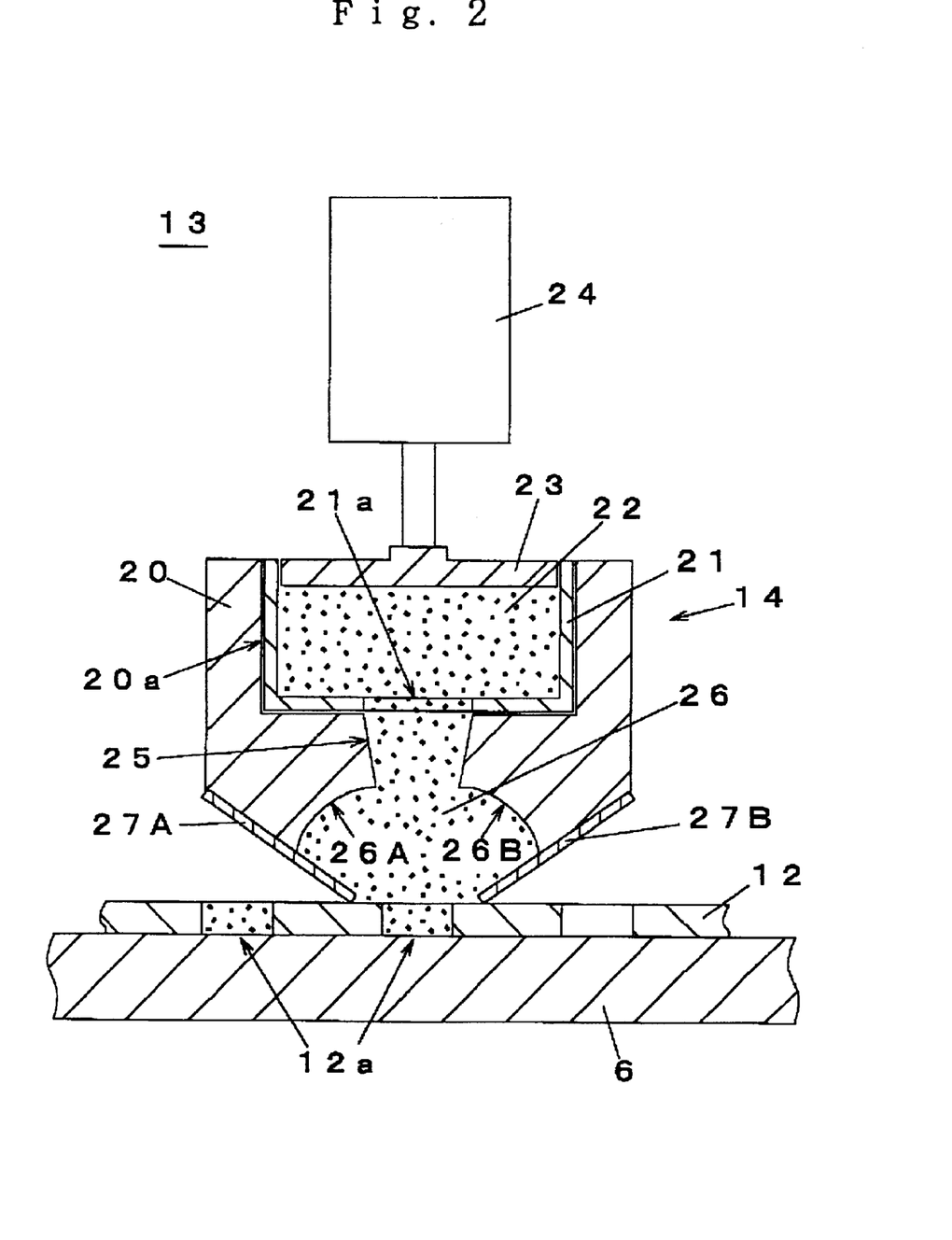
FIG. 2 is a sectional side elevation of a squeegee head for screen printing in another embodiment of the present invention.
Figure 3:
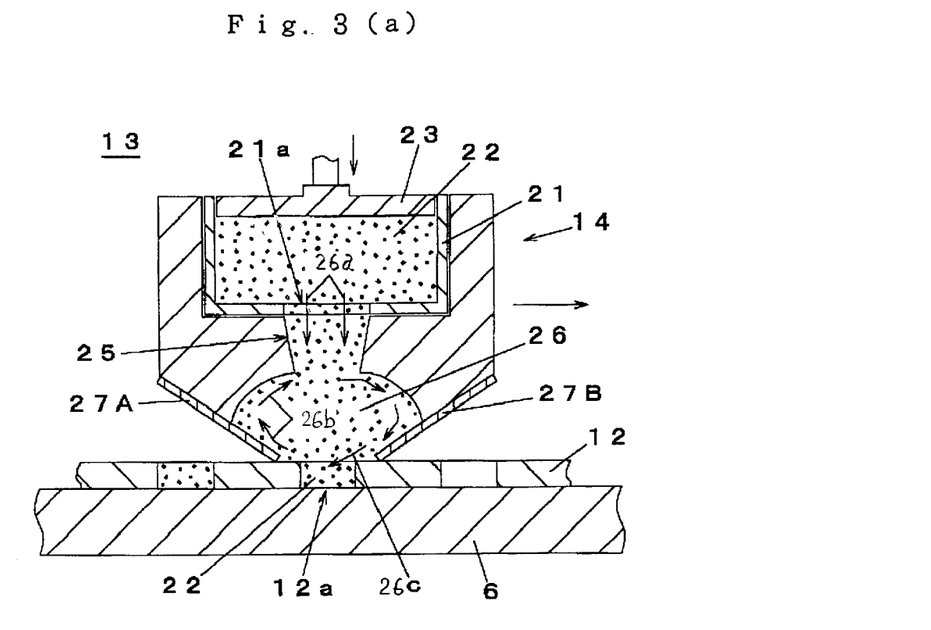

FIG. 1 is a side view of a screen printing apparatus in an exemplary embodiment of the present invention. FIG. 2 is a sectional side elevation of a squeegee head for screen printing. FIGS. 3(a) and (b) are a sectional side elevation of a squeegee head for screen printing.

The construction of the screen printing apparatus will be described in the following. In FIG. 1, positioning portion 1 to decide the position of substrate 6 is formed of a movable table and Z-axis table 5 disposed thereon. The movable table moves horizontally and is formed of X-axis table 2, Y-axis table 3 and θ-axis table 4. The X-axis table 2, Y-axis table 3 and θ-axis table 4 are stacked. Substrate holder 7 with damper 8 to hold the substrate 6 is disposed on the Z-axis table 5.

Screen mask 10 is disposed above the positioning portion 1. The screen mask 10 includes holders 11 and a mask plate 12 attached to the holders. The mask plate 12 has pattern holes (not shown) formed in the positions corresponding to the printing portions of the substrate 6 subjected to printing.

Squeegee head 13 is disposed above the screen mask 10. The squeegee head 13 is moved horizontally reciprocally on the mask plate 12 by moving means (not shown). Printing section 14 to fill cream solder into pattern holes is disposed under the squeegee head 13 and is abutted on the surface of the mask plate 12.

Next, the construction of the printing section 14 will be described with reference to FIG. 2. In FIG. 2. main body 20 is a block member being long and slender in shape. The main body 20 is long and slender in the widthwise direction of the mask plate 12 (in a direction vertical to the paper surface). The length of the main body 20 is set so as to cover the width of the substrate 6 subjected to printing. There is provided a recess 20a in the upper part of main body 20, and cartridge 21 containing cream solder 22 as past is removably installed in the recess 20a.

The cartridge 21 functions as a storage section (paste storage section) to store the cream solder 22. A predetermined amount of cream solder 22 is stored in the storage section. The cartridge 21 is installed in the main body 20 when printing is performed. Pressure plate 23 which serves to pressurize the cream solder 22 in the storage section is inserted into the opening at top of the cartridge 21. When the pressure plate 23 is pressed downward by cylinder 24, the cream solder 22 in the cartridge 21 is pressurized, then the cream solder 22 is forced to go downward from opening 21a provided at the bottom of the cartridge. The cylinder 24 and the pressure plate 23 function as a pressure member that pressurizes the paste or the cream solder.

Transfer passage 25 for cream solder 22 is provided at the bottom of recess 20a, corresponding to the opening position of the cartridge 21. The transfer passage 25 communicates with printing space portion 26 formed at the bottom of the main body 20. The printing space portion 26 is surrounded by the bottom of main body 20 and two scraping members 27A, 27B internally obliquely disposed at the bottom of the main body 20. The two scraping members include a first scraping member 27A and a second scraping member 27B. The scraping members 27A, 27B form front and rear walls in the squeezing direction of the printing space portion 26. The bottom ends of the scraping members 27A, 27B are abutted on the surface of the mask plate 12. In printing operation, the pressurized cream solder 22 is contained in the printing space portion 26. And then, the cream solder 22 is contacted on the surface of the mask plate 12 through a printing aperture formed between first scraping member 27A and second scraping member 27B.

When the pressure plate 23 is pressed down, the cream solder 22 in the cartridge 21 is pressurized. This pressure causes the cream solder 22 to go downward, through the transfer passage 25, into the printing space portion 26. The transfer passage for cream solder 22 includes a reduced portion having a sectional area reduced. When the cream solder 22 passes through the reduced portion, the cream solder 22 is decreased in viscosity, and thereby, the properties of cream solder 22 will be improved so as to become suitable for screen printing. Also, in the present exemplary embodiment, only one passage 25 is formed in the middle of the construction. However, it is not so limited but is susceptible of using a configuration such that the transfer passage 25 includes a plurality of smaller-diameter portions. Preferably, there are provided a plurality of smaller-diameter openings in honeycomb structure.

Also, the upper surfaces of the printing space portion 26 are the bottom surfaces 26A, 26B of the main body 20. The cross-section of bottoms 26A, 26B of main body 20 is generally R-shaped with R curvature. With the cream solder 22 filled in the printing space portion 26, the printing section 14 is horizontally moved while the bottom ends of scraping members 27A, 27B are abutted on the surface of the screen mask 10. In this way, the cream solder 22 in the printing space portion 26 makes a rolling motion. Then, since the rolling guide surfaces 26A, 26B of the printing space portion 26 are generally R-shaped, the rolling motion of cream solder 22 will be enhanced. That is, the bottom surfaces 26A, 26B of main body 20 function as rolling guide surfaces 26A, 26B to enhance the rolling motion of cream solder 22. Here, as for the sectional shape of rolling guide surfaces 26A, 26B, it is not limited to an R-shaped cross-section but is susceptible of being a sectional shape such that the rolling guide surface 26A, 26B is gradually curved as a whole. A shape such that the surface is gradually curved includes, for example, a shape such that a plurality of linear portions form a continuous broken line.

In the above configuration, it is preferable to include a configuration as follows.

The storage section; the transfer passage and the printing space portion are located just above the printing aperture.

The printing space portion has a top opening that leads to the transfer passage; the rolling guide surfaces include a first rolling guide surface positioned at the back of the top opening and a second rolling surface positioned at the front of the top opening, respectively in the forward direction of the squeegee head; and the first rolling guide surface is circularly curved about a specific position within the printing space, and the second rolling guide surface is circularly curved about an another specific position within the printing space.

The storage section, the transfer passage and the printing space portion are located just above the printing aperture; the printing space portion has a top opening that leads to the transfer passage; the rolling guide surfaces include a first rolling guide surface positioned at the back of the top opening and a second rolling surface positioned at the front of the top opening, respectively in the forward direction of the squeegee head; and the first rolling guide surface is circularly curved about a specific position within the printing space, and the second rolling guide surface is circularly curved about an another specific position within the printing space; and the first rolling guide surface and the second rolling guide surface are symmetrically shaped with respect to the vertical plane passing through the center of the printing aperture.

The first scraping member that forms the rear wall of the printing space portion has such a bottom shape as to scoop the paste sticking to the plate surfaces except the pattern holes and to return the paste into the printing space when the squeegee head moves in the forward direction; and the rolling motion of the paste is enhanced due to the operation of returning the scooped paste into the printing space portion as well as the function of the rolling guide surfaces.

The transfer passage includes a reduced portion, and the reduced portion has a shape such that the paste is decreased in kinetic viscosity.

Next, cream solder printing by squeegee head 13 provided with printing section 14 having a construction as described above will be explained with reference to FIGS. 3(a) and (b). In FIG. 3(a), the squeegee head 13 is horizontally moved on screen mask 12 while cream solder 22 in cartridge 21 is pressurized by pressure plate 23. The pressure applied to the cream solder 22 in this transfer process causes the cream solder 22 to move from opening 21a into printing space portion 26 through passage 25 as shown by arrow 26a.

In the transfer process, the sectional area of the transfer passage is reduced by the passage 25, then the cream solder 22 is kneaded, and the kinetic viscosity of the cream solder 22 will be decreased. And, as the squeegee head 13 is horizontally moved, the cream solder 22 in the printing space portion 26 is scooped by the bottom end of first scraping member 27A positioned at the back side in the moving direction of the squeegee head, and the scooped cream solder is given an oblique movement along the surface of the first scraping member 27A.

Thus, the cream solder 22 obliquely moved upward in the printing space portion 26 is guided by rolling guide surfaces 26A, 26B (see FIG. 2) and makes a rolling motion in the direction of arrow 26b. That is, the cream solder 22 rotates in the printing space portion 26 and moves down along the surface of second scraping member 27B positioned at the front side in the squeezing direction. Further, the cream solder 22 moves in the direction of arrow 26c, and after that, advances into pattern hole 12a.

In this way, since the cream solder 22 is given a movement in the direction of arrow 26c, the cream solder 22 is sufficiently filled even into the left-hand portion (at the back side in the forwarding direction of squeegee head 13) of the pattern hole 12a where especially gaps not filled with solder are liable to be generated. That is, since the printing space portion 26 includes rolling guide surfaces 26A, 26B which are shaped as described, the rolling ability of cream solder 22 is improved, and as a result, it is possible to greatly improve the performance of filling cream solder 22 into pattern hole 12a.

FIG. 3(b) shows how a pressing force is applied to the cream solder 22 during printing operation. When pressure plate 23 is pressed down with pressing force 23F, the pressure applied by the pressing force to the cream solder 22 acts particularly on pattern hole 12a located just below passage 25 (as shown by arrow 26b). In this way, the cream solder 22 will be reliably filled in even when the pressing force 23F of pressure plate 23 is set to a smaller value.

Also, since each of two scraping members 27A, 27B is deflected from the position just under the passage 25, pressure 26e applied by pressing force F to the scraping members 27A, 27B is lower. Accordingly, it is possible to prevent generation of "solder leakage" or leakage of cream solder 22 from the clearance between the surface of screen mask 12 and the scraping members 27A, 27B.

In the present exemplary embodiment, cream solder is used as paste. However, it is not so limited but is susceptible of using paste materials such as conductive paste.

Thus, since the squeegee head 13 has a configuration as described above, the rolling ability of cream solder 22 will be improved, and thereby, the cream solder 22 is reliably filled into the pattern hole 12a. That is, the performance of filling cream solder 22 into pattern hole 12a will be remarkably improved. Consequently, the pressing force applied to the cream solder 22 can be set to a lower level. Accordingly, it is possible to eliminate problems of solder leaking that may be caused due to excessive pressing forces and to disuse attached mechanisms such as a receptacle jig to receive leaked solder which has been conventionally installed in a screen printing apparatus, and thereby, it is possible to realize a simplified screen printing apparatus.

As described above, in the configuration of the present invention, paste in a paste storage section is pressurized and the paste is led into a printing space portion located above a mask plate. During squeezing operation, the rolling motion of the paste in the printing space portion is enhanced by rolling guide surfaces, thereby improving the rolling ability of the paste. As a result, a high pressure is not required to reliably fill the paste into pattern holes. In this way, the performance of filling the paste into pattern holes will be remarkably improved, and "paste leakage" may be prevented. Thus, it is possible to obtain excellent printing qualities.

What is claimed is:

1. A screen printing apparatus for printing paste on a substrate, comprising:
   (a) a positioning member on which said substrate is placed,
   (b) a mask plate having pattern holes, said mask plate being located above said positioning member, and
   (c) a squeegee head which slides on a surface of said mask plate,
   wherein said squeegee head comprises:
      (d) a printing section, and (e) a pressure member; and said printing section comprises:
      (f) a storage section to store paste,
      (g) a printing space portion with a bottom opening, said printing space portion being formed below said storage section,
      (h) a transfer passage providing a channel between said storage section and said printing space portion, said transfer passage being formed between said storage section and said printing space portion, and
      (i) scraping members disposed at said bottom of said printing space portion,
   wherein said printing space portion includes a rolling guide surface to enhance the rolling motion of the paste, said rolling guide surface having a sectional shape with R curvature,
   wherein, when the paste stored in said storage section is pressurized by said pressure member while said squeegee head is sliding on said mask plate, the paste stored in said storage section is filled into said printing space portion through said transfer passage, and said rolling guide surface of said printing space portion serve to enhance the rolling motion of the paste, then said paste which is rolling is forced out of the bottom opening of said printing space portion and is printed on said substrate via said mask plate,
   wherein said transfer passage has an overall width which is less than the width of the storage section, which results in a reduction of the viscosity of the paste when the paste passes through the transfer passage.

2. The screen printing apparatus of claim 1, wherein said storage section, said printing space portion and said transfer passage are formed of main body members.

3. The screen printing apparatus of claim 1, wherein said transfer passage includes a reduced portion having a sectional area reduced.

4. The screen printing apparatus of claim 1, wherein said scraping members include a first scraping member disposed at a back side of said squeegee head, and a second scraping member disposed at a front side of said squeegee head;

said first scraping member forms a rear wall for said printing space portion, said second scraping member forms a front wall for said printing space portion, a printing aperture is formed between said first scraping member and said second scraping member, and the paste is pushed out of said printing aperture.

5. The screen printing apparatus of claim 4, wherein said first scraping member is disposed under said transfer passage, said second scraping member is disposed under said transfer passage, and said printing aperture is positioned below said transfer passage.

6. The screen printing apparatus of claim 4, wherein said storage section, said transfer passage and said printing space portion are formed of main body members, each member of said first scraping member and said second scraping member has a plate-like shape, and each of said scraping members is obliquely disposed at the bottom of said main body members so that said printing space portion is reduced in sectional area toward.

7. The screen printing apparatus of claim 1, wherein said storage section, said printing space portion and said transfer passage are formed of main body members, said scraping members include a first scraping member disposed at a back side of said squeegee head, and a second scraping member disposed at a front side of said squeegee head, said first scraping member forms a rear wall for said printing space portion, said second scraping member forms a front wall for said printing space portion, and a printing aperture is formed between said first scraping member and said second scraping member, and the paste is pushed out of said printing aperture.

8. The screen printing apparatus of claim 7, wherein, when said squeegee head moves in the forward direction, said first scraping member that forms the rear wall of said printing space portion has such a bottom shape as to scoop the paste sticking to the plate surfaces except said pattern holes and to return the paste into said printing space portion, and the rolling motion of the paste is enhanced due to the operation of returning said paste scooped into said printing space portion as well as the function of said rolling guide surfaces.

9. The screen printing apparatus of claim 1, wherein said rolling guide surface forms an upper surface of said printing space portion.

10. The screen printing apparatus of claim 1, wherein said storage section includes a cartridge to store the paste, and said cartridge disposed may be removed from said storage section.

11. The screen printing apparatus of claim 1, wherein said transfer passage has a plurality of smaller-diameter paths formed in honeycomb structure, and the paste is forced out into said printing space through said plurality of smaller-diameter paths.

12. The screen printing apparatus of claim 1, wherein said storage section, said transfer passage and said printing space portion are positioned just above printing aperture.

13. The screen printing apparatus of claim 1, wherein said printing space has a top opening that leads to said transfer passage, said rolling guide surface includes a first rolling guide surface positioned at a back of said top opening and a second rolling guide surface positioned at a front of said top opening, respectively in the forward direction of said squeegee head, said first rolling guide surface is circularly curved about a specific position within said printing space portion, and said second rolling guide surface is circularly curved about another specific position within said printing space portion.

14. The screen printing apparatus of claim 1, wherein said storage section, said transfer passage and said printing space portion are positioned just above a printing aperture, said printing space portion has a top opening that leads to said transfer passage, said rolling guide surface includes a first rolling guide surface positioned at a back of said top opening and a second rolling surface positioned at a front of said top opening, respectively in the forward direction of said squeegee head, said first rolling guide surface is circularly curved about a specific position within said printing space portion, said second rolling guide surface is circularly curved about another specific position within said printing space portion, and said first rolling guide surface and said second rolling guide surface are symmetrically shaped with respect to the vertical plane passing through the center of said printing aperture.

15. The screen printing apparatus of claim 1, wherein said transfer passage has a shape such that the paste is decreased in kinetic viscosity.

16. The screen printing apparatus of claim 1, wherein said paste is at least one of cream solder and conductive paste.

17. The screen printing apparatus of claim 1, wherein said transfer passage paste into said printing space portion as well as the function of said rolling guide suface.

18. The screen printing apparatus of claim 1, wherein said transfer passage has only a single opening.

19. A screen printing method for printing paste on a substrate, comprising the steps of:

(a) sliding a squeegee head on a surface of a mask plate placed on said substrate, (b) tilling the paste forced out of a printing aperture of said squeegee head into pattern holes formed in said mask plate according to sliding operation of said squeegee head, and (c) printing the paste, filled into said pattern holes, on said substrate, wherein said step of sliding said squeegee head and forcing the paste out of said printing aperture comprises the steps of:

(d) pressurizing the paste stored in a storage section, (e) forcing the pressurized paste out into a printing space portion through a transfer passage, (f) enhancing the rolling motion of the paste forced out into said printing space portion, and (g) forcing the rolling paste out of said printing aperture, wherein said transfer passage has an overall width which is less than the width of the storage section, which results in a reduction of the viscosity of the paste when the paste passes through the transfer passage, and said printing space portion including a rolling guide surface having a sectional shape with R curvature, and said squeegee head comprises scraping members disposed at the bottom of said printing space portion.

20. The screen printing method of claim 19, wherein said transfer passage decreases the kinetic viscosity of the paste when the paste passes through said transfer passage.

21. The screen printing method of claim 19, wherein said squeegee head further comprises:

said storage section in which paste is stored, said printing space portion formed below said storage section, and said transfer passage formed between said storage section and said printing space portion, said transfer passage forming a channel between said storage and said printing space portion, wherein said scraping members include a first scraping member disposed at a back side of said squeegee head, and a second scraping member disposed at a front side of said squeegee head, said printing aperture is formed between said first scraping member and said second scraping member, and the paste is forced out of said printing aperture.

22. The screen printing method of claim 21, wherein said step (a) includes a step of moving said squeegee head horizontally with the paste filled in said printing space portion.

23. The screen printing method of claim 21, wherein said step (a) includes a step of moving said squeegee head horizontally while pressurizing the paste stored in said storage section.

24. The screen printing method of claim 21, wherein when said squeegee head moves in a forward direction, said first scraping scoops the paste sticking to plate surfaces except said pattern holes and returns the paste into said printing space portion, and the rolling motion of the paste is enhanced due to the operation of returning the scooped paste into said printing space portion as well as the function of said rolling guide surface.

25. The screen printing method of claim 19, wherein said printing space portion has a top opening that leads to said transfer passage, said rolling guide surface includes a first rolling guide surface positioned at the back of said top opening and a second rolling guide surface positioned at the front of said top opening, respectively in the forward direction of said squeegee head, said first rolling guide surface is circularly curved about a specific position within said printing space portion, and said second rolling guide surface is circularly curved about another specific position within said printing space portion.

26. The screen printing method of claim 19, wherein said transfer passage has tapered surfaces such that the diameter of the transfer passage decreases as the distance from the storage section increases.

27. The screen printing method of claim 19, wherein said transfer passage has only a single opening.

* * * * *